United States Patent
Popescu (10) Patent No.: US 9,784,810 B2
(45) Date of Patent: Oct. 10, 2017

(54) MAGNETIC RESONANCE METHOD AND APPARATUS FOR QUICK DETECTION OF REGIONS OF MODIFIED TEMPERATURE

(71) Applicant: Stefan Popescu, Erlangen (DE)

(72) Inventor: Stefan Popescu, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 852 days.

(21) Appl. No.: 14/087,239

(22) Filed: Nov. 22, 2013

(65) Prior Publication Data

US 2014/0145720 A1 May 29, 2014

(30) Foreign Application Priority Data

Nov. 23, 2012 (DE) .................. 10 2012 221 463

(51) Int. Cl.
*G01V 3/00* (2006.01)
*G01R 33/48* (2006.01)

(52) U.S. Cl.
CPC .................. *G01R 33/4804* (2013.01)

(58) Field of Classification Search
CPC A61B 5/055; G01R 33/5608; G01R 33/4828; G01R 33/543; G01R 33/50
USPC ......................................................... 324/309
See application file for complete search history.

(56) References Cited

U.S. PATENT DOCUMENTS

| 4,914,608 A | 4/1990 | LeBihan et al. |
| 5,916,161 A | 6/1999 | Ishihara et al. |
| 2002/0058868 A1 | 5/2002 | Hoshino et al. |
| 2005/0065429 A1* | 3/2005 | Zhou ................. G01R 33/4804 600/412 |
| 2009/0182223 A1 | 7/2009 | Dai et al. |
| 2010/0036235 A1 | 2/2010 | Lamerichs et al. |
| 2011/0279116 A1 | 11/2011 | Sakakura et al. |
| 2012/0025825 A1* | 2/2012 | Porter ................ G01R 33/5617 324/309 |
| 2012/0068703 A1* | 3/2012 | Gross .................... G01R 33/50 324/309 |

FOREIGN PATENT DOCUMENTS

| EP | 0534607 A1 | 3/1993 |
| JP | 2000300535 A | 10/2000 |
| JP | 2000300536 A | 10/2000 |
| JP | 2002058658 A | 2/2002 |
| JP | 2003325510 A | 11/2003 |

(Continued)

OTHER PUBLICATIONS

Al-Bataineh et al., "MR thermometry characterization of a hyperthermia ultrasound array designed using the k-space computational method," Biomedical Engineering OnLine (2006), www.biomedical.engineering-online.com/content/5/1/56.

(Continued)

*Primary Examiner* — Walter L Lindsay, Jr.
*Assistant Examiner* — Frederick Wenderoth
(74) *Attorney, Agent, or Firm* — Schiff Hardin LLP (57) ABSTRACT

In a method and apparatus to quickly determine regions of modified temperature in a sample volume by magnetic resonance tomography using a multi-echo sequence, one or more one-dimensional or two-dimensional images of regions of modified temperature are respectively determined.

20 Claims, 4 Drawing Sheets

(56) References Cited

FOREIGN PATENT DOCUMENTS

JP         2003325510 A    11/2003
WO    2005/069032 A1    7/2005

OTHER PUBLICATIONS

Rieke et al., "MR Thermometry," Journal of Magnetic Resonance Imaging, vol. 27 (2008), pp. 376-390.
"Digital Tomosynthesis," www.wikiradiography.com/page/Digital+Tomosynthesis (2012).

* cited by examiner

MAGNETIC RESONANCE METHOD AND APPARATUS FOR QUICK DETECTION OF REGIONS OF MODIFIED TEMPERATURE

BACKGROUND OF THE INVENTION

Field of the Invention

The present invention concerns a method to quickly determine regions of modified temperature in sample volume by magnetic resonance tomography using a multi-echo sequence, as well as a magnetic resonance tomography apparatus to implement such a method.

Description of the Prior Art

In magnetic resonance measurements, the interaction of magnetic moments of atomic nuclei (the nuclear spins) with an external magnetic field is detected. The nuclear spins are aligned in an external basic magnetic field and precess with the Larmor frequency (which depends on the value of the magnetic moment of the atomic nuclei and the external magnetic field) around the axis of the alignment in the magnetic field, after excitation by an alternating external electromagnetic (radio-frequency) field. The atomic nuclei thereby generate an alternating electromagnetic field at the Larmor frequency. The initial amplitude, the phase coherence of this precession, and the decay of the excitation, change depending on the temperature of a sample in which the atomic nuclei are located. A temperature change of the sample between the two measurements can be determined by comparison of the two measurements.

For example, from EP 534607 A1 it is known to employ magnetic resonance tomography with a diffusion-sensitive imaging method, in order to monitor a medical treatment that makes use of heat. The local temperature is linked with the local diffusion rate and a temperature change can be depicted by imaging (mapping) of the temperature change. Even with the fastest known sequences, a complete three-dimensional acquisition requires a certain time that, due to different physical effects such as relaxation times, cannot be shortened without loss of sensitivity.

In the acquisition of magnetic resonance data, the frequency of the radio-frequency excitation signals has increased with the use of ever stronger basic magnetic fields, up to 3 T or more, with which the specific absorption rate SAR in turn increases quadratically. The measurement time can be limited by SAR regulations that set the maximum allowable heating of the body of the patient by the radio-frequency signals. In particular, non-homogeneous distributions of the field strengths in the patient (as can occur particularly given use of local transmission coils) are critical and can lead to a local overheating of and damage to tissue, in spite of complying with the limit values for the entire body. Furthermore, it is a problem that locally strictly limited temperature elevations cool quickly due to the distribution of thermal energy by diffusion or blood flow, and thus in a slow measurement are not recognizable in a form that indicates the risk such temperature elevations present to damaging tissue.

Various methods are also known to destroy pathological tissue by means of hyperthermia or ablation. In addition to completely killing the pathological tissue, care must be taken to preserve the surrounding tissue. This can be achieved by heating the pathological tissue optimally quickly and briefly to or above the critical temperature. Due to the heat propagation into the surrounding tissue, it is also necessary to measure the temperature thereof in very short time intervals.

SUMMARY OF THE INVENTION

An object of the present invention is to provide a magnetic resonance method and apparatus that enable a temperature change to be localized quickly.

This object is achieved by the method according to the invention that includes (a) excitation of nuclear spins in a sample volume by radiating a radio-frequency pulse in a static magnetic field, (b) acquiring and storing a first projection of an integral of a magnetic resonance signal in the sample volume across a first n-dimensional space onto a first m-dimensional space with the use of a multi-echo sequence, wherein n+m=3; and a first projection of an integral of a magnetic resonance signal in the sample volume across a second n-dimensional space onto a second m-dimensional space with the use of the multi-echo sequence, wherein the first and second m-dimensional space are not parallel to one another, and wherein n+m=3. Furthermore, the method according to the invention includes (c) repetition of (b), wherein the acquisition and storage of a respective second projection take place, and (d) determining a temperature change by a difference calculation of the first projection and second projection across the first n-dimensional space and a difference calculation of the first projection and second projection across the second n-dimensional space.

In the method according to the invention, an acquisition takes place of a projection onto two m-dimensional spaces that are not parallel to one another. The term "space" is used herein in the mathematical sense, not just as Euclidean space with three coordinate axes situated orthogonal to one another. A one-dimensional space in this sense is a line or straight line, a two-dimensional space is a surface or plane. The sum of the natural numbers n and m is 3 and corresponds to the number of dimensions of the Euclidean space. Therefore, it is possible to acquire the spatial position of a region of modified temperature with just two projections instead of needing to scan the entire sample volume spatially in slices. Transient temperature peaks thus also can be detected. By contrast, artifacts that have experienced no change in the short intervening time period are masked out.

A magnetic resonance tomography apparatus according to the invention for quick determination of regions of modified temperature in a sample volume has a basic field magnet to generate a basic magnetic field B0 in a sample volume and gradient coils to generate magnetic gradient fields in the sample volume. Furthermore, the magnetic resonance tomography apparatus has one or more antennas to emit and/or receive radio-frequency signals inside and outside of the sample volume, a supply unit to control the gradient coils and the antenna/antennas with signals and receive radio-frequency signals from the antenna; and a controller to control the supply unit and evaluate the received radio-frequency signals.

The controller is designed to control the supply unit so that (a) the supply unit excites nuclear spins in the sample volume in a magnetic field by radiating a radio-frequency pulse. Furthermore, the controller is designed to control the supply unit to (b) evaluate the radio-frequency signals detected by the supply unit so that, by means of a multi-echo sequence, a first projection of an integral of a magnetic resonance signal in the sample volume across a first n-dimensional space onto a first m-dimensional space is detected and stored, wherein n+m=3. n and m are natural numbers not equal to zero. The controller is furthermore designed to control the supply unit and to evaluate the radio-frequency signals detected by the supply unit so that, (c) by means of the multi-echo sequence, the controller detects and stores a first projection of an integral of a magnetic resonance signal in the same volume across a second n-dimensional space onto a second m-dimensional space, wherein the first m-dimensional space and second m-dimensional space are not parallel to one another, and wherein n+m=3.

The controller is designed to repeat (a) through (c), wherein the excitation takes place with the radio-frequency pulse and a second projection is respectively acquired and stored. The controller is also designed to determine a temperature change by calculating a difference of the first projection and second projection for the projections across the first n-dimensional space and the second n-dimensional space.

The magnetic resonance tomograph according to the invention shares the advantages of the method according to the invention.

In an embodiment of the method, (c) also includes a repetition of (a) before (b).

When (a), the excitation of nuclear spins in the sample volume by radiating a radio-frequency pulse, is repeated, the difference calculation allows (d) a temperature change caused only by the radio-frequency pulse to be determined, insofar as other influences are minimized.

In a preferred embodiment, the method according to (b) furthermore includes (b1), and after (d) includes step (d1), wherein (b1) is an acquisition and storage of a first projection of an integral of a magnetic resonance signal in the sample volume across a third n-dimensional space onto a third m-dimensional space by means of the multi-echo sequence, wherein the first and third m-dimensional space as well as the second and third m-dimensional space are not parallel to one another, and wherein n+m=3, and (d1) is a difference calculation of the first projection and second projection across third n-dimensional space in order to determine the temperature change.

Because the two or three m-dimensional spaces are not parallel to one another, the three m-dimensional spaces span a coordinate space in which a temperature change in three-dimensional space can be localized and limited to a surface or in a volume, by means of the two or three projections. The acquisition only requires a time period for an excitation and 3-times-m multi-echo sequences, and can be executed significantly more quickly in comparison to a conventional complete tomography procedure, so that, in particular, short temperature changes can be detected.

In an embodiment of the method according to the invention, n=1 and m=2. In this embodiment, magnetic resonance signals are detected along lines or straight lines and integrated or totaled, and projected onto a two-dimensional surface. In this embodiment, the method provides two or three two-dimensional mappings of the temperature changes of the sample volume, with the surfaces not being parallel to one another and therefore providing two or three views of the sample volume respectively from different directions.

The position of the temperature change in the sample volume is advantageously made clear to the user from these two-dimensional mappings of the temperature change, particularly when the surfaces are planes that each includes two axes of the Cartesian coordinate system.

In a further embodiment, n=2 and m=1. In this embodiment, magnetic resonance signals are acquired along surfaces or planes and are integrated or totaled and projected onto a one-dimensional line or straight line. In this embodiment, the method provides two or three one-dimensional mappings or temperature changes of the sample volume, with the lines not being parallel to one another.

The position of the temperature change in the sample volume can be determined from these one-dimensional mappings of the temperature change, particularly when the lines are straight lines that form a Cartesian coordinate system. In this case, the position is on a respective line that directly corresponds to the coordinate of the temperature change in the sample volume on the corresponding coordinate axis.

In an embodiment of the method, the multi-echo sequence is a single shot sequence.

A single shot sequence requires only a single excitation pulse and thus reduces the radio-frequency power radiated into the patient and the measurement duration, because a wait for the spin relaxation does not need to occur before a new excitation.

In an embodiment of the method, spin echoes of the multi-echo sequence are generated by gradient fields.

When the spin echoes are generated by gradient fields, the radio-frequency energy radiated into the patient is advantageously reduced due to the absence of 180° spin reversal pulses (which are not needed).

In an embodiment of the method, a temperature change caused by the radio-frequency pulse is determined.

In connection with the single shot sequence and the reversal of the spin echo by gradient fields, assuming there is no additional heat source independent of the measurement method, it is possible to determine the heating due to a single radio-frequency pulse, and thus to promptly detect a danger to the patient due to a locally limited heating.

In an embodiment of the method according to the invention, it is also possible to generate the spin echoes by a refocusing pulse.

The generation of the spin echoes by refocusing pulses reduces the number of pulses applied to the gradient coils, and therefore advantageously reduces the noise exposure for the patient.

In a further embodiment of the method according to the invention, before (c), a temperature change in at least one partial region of the sample volume is caused by a heat source or a cryo-source.

In the method according to the invention, a temperature change in the entire sample volume or at least a partial volume can also be caused before (c) by a heat source or cryo-source, and the method according to the invention determines the achieved temperature change in (d). The effect of a thermal treatment (for example the destruction of cancerous tissue via ablation) can thus be monitored.

In an embodiment of the method according to the invention, the heat source is an ultrasound field in the sample volume. The effect of a hypothermic treatment or ablation can advantageously be monitored by a focused ultrasound field.

In a further embodiment of the method according to the invention, the heat source is a radio-frequency electromagnetic field in the sample volume. The effect of a hypothermic treatment or ablation can advantageously be monitored by an electromagnetic radio-frequency field.

In a preferred embodiment, the method according to the invention furthermore includes a determination or limitation of a three-dimensional position of a region of the temperature change in the sample volume by means of the projections along the first axis, the second axis and the third axis.

This embodiment enables the location of the temperature change to be determined and, for example, for a review to be made as to whether a hypothermic treatment or ablation is executed by a heating at a predetermined location, or whether (for example) a local transmission coil leads to a local heating endangering the patient.

DESCRIPTION OF THE PREFERRED EMBODIMENTS

Figure 1:
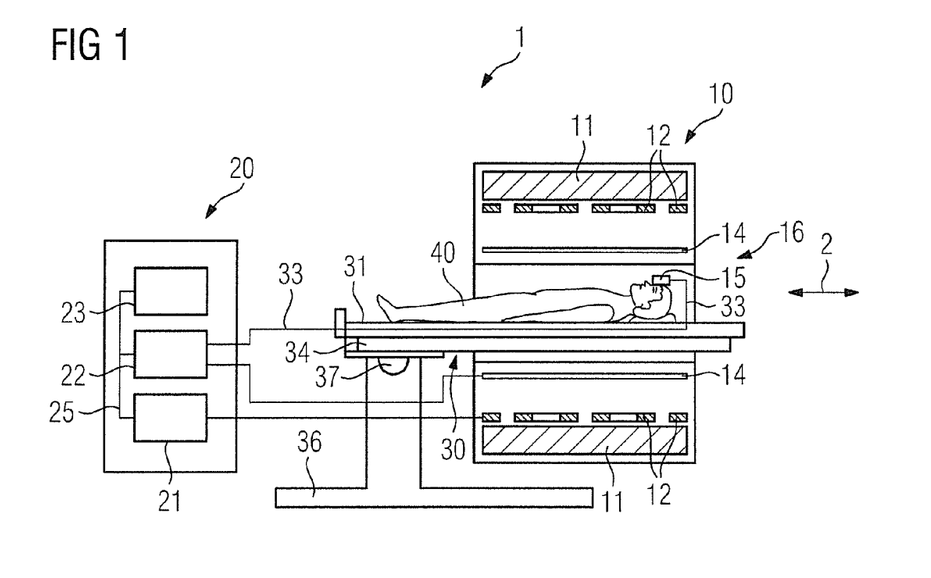
FIG. 1 schematically illustrates of a magnetic resonance tomography apparatus according to the invention.

FIG. 1 is a schematic depiction of a magnetic resonance tomography apparatus 1 for implementation of the method according to the invention.

The magnet unit 10 has a basic field magnet 11 that generates a static magnetic field B0 for alignment of nuclear spins of a sample or a patient 40 in a sample volume. The sample volume is located in a tunnel or bore 16 that extend through the magnet unit 10 in a longitudinal direction 2. The basic field magnet 11 is typically a superconducting magnet that can provide magnetic fields with a magnetic flux density of up to 3 T or more in the most recent apparatuses. However, permanent magnets or electromagnets with room temperature conducting coils can also be used for lower field strengths.

Furthermore, the magnet unit 10 has gradient coils 12 that are designed to superimpose magnetic fields that exhibit gradients in each of three spatial directions on the magnetic field B0 for spatial differentiation of the acquired imaging regions in the sample volume. The gradient coils 12 are typically coils made of normally conducting wires that can generate fields orthogonal to one another in the sample volume.

The magnet unit 10 likewise has a body coil 14 that is designed to radiate a radio-frequency signal (supplied via a signal line) into the sample volume and to receive resonance signals emitted by the patient 40 and to emit them via the signal line. However, for the emission of the radio-frequency signal and/or the reception, the body coil 14 is preferably replaced by local coils 15 that are arranged near the patient 40 in the tunnel 16.

A control unit 20 supplies the magnet unit 10 with the various signals for the gradient coils 12 and the body coil 14 or, respectively, the local coils 15 and evaluates the received signals.

The control unit 20 thus has a gradient controller 21 that is designed to supply the gradient coils 12 with variable currents via feed lines, which variable currents provide the desired gradient fields in the sample volume in a time-coordinated manner.

Furthermore, the control unit 20 has a radio-frequency unit 22 that is designed to generate a radio-frequency pulse with a predetermined time curve, amplitude and spectral power distribution to excite a magnetic resonance of the nuclear spins in the patient 40. Pulse powers in the kilowatt range can thereby be achieved.

The radio-frequency unit 22 is also designed to evaluate radio-frequency signals with regard to amplitude and phase, which radio-frequency signals are received from the body coil 14 or a local coil 15 and supplied via a signal line 33 to the radio-frequency unit 22. These are radio-frequency signals that nuclear spins in the patient 40 emit as a response to the excitation by a radio-frequency pulse in the magnetic field B0, or in a resulting magnetic field formed by a superposition of B0 and the gradient fields.

Furthermore, the control unit 20 has a controller 23 designed to coordinate timing of the operation of the gradient controller 21 and the radio-frequency unit 22. For this purpose, the controller 23 is connected and involved in a signal exchange with the other units 21, 22 via a signal bus 25. The controller 23 is designed to receive and process signals from the patient 40 that have been evaluated by the radio-frequency unit 22, or to provide and temporally coordinate pulse and signal shapes to the gradient controller 22 and the RF pulse generation unit 23.

The patient 40 is arranged on a patient bed 30 of the type known in magnetic resonance tomography. The patient bed 30 has a first support 36 that is arranged below a first end 31 of the patient bed 30. In order for the support 36 to hold the patient bed 30 in a horizontal position, it typically has a base that extends along the patient bed 30. In order to move the patient bed 30, the base can also have a of movement mechanism (such as a rolling mechanism). Except for the base 36 at the first end 31, no structural element is arranged between the floor and the patient bed 30, such that said patient bed 30 can be introduced into the tunnel 16 of the field magnet 11 up to the first end 31. In FIG. 1, linear rail systems 34 are shown that connect the support 36 with the patient bed 30 so as to allow mobility, such that the patient bed can be moved along the longitudinal direction 2. For this purpose, the linear rail system has an actuator (drive) 37 that enables the patient bed 30 to be moved in the longitudinal direction 2, controlled by an operator or by the controller 23, such that it is possible to examine regions of the body of the patient that have a larger dimension than the sample volume in the tunnel 16.

Figure 2:
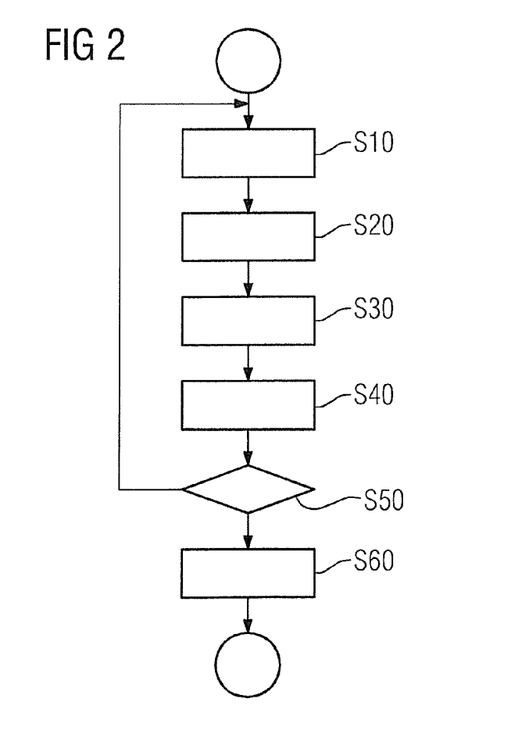
FIG. 2 is a flowchart of an embodiment of the method according to the invention.

In a flowchart, FIG. 2 shows an embodiment of the method according to the invention.

In Step S10, nuclear spins in the sample volume are deflected by a flip angle 0 out of the alignment parallel to the magnetic field B0 via a radio-frequency pulse in said basic magnetic field B0. For this purpose, the radio-frequency pulse with the Larmor frequency is radiated into the patient 40 via the body coil 14 or a local coil 15. The flip angle 0 is dependent on the duration of the pulse and the strength of the radiated electromagnetic fields. The Larmor frequency results from the magnetic field strength of the magnetic field B0 at the location of the nuclear spin and the magnetic moment of the atomic nucleus. The Larmor frequency varies due to spatial variations of the magnetic field B0 and influences of the atomic environment of the nucleus, such that the radio-frequency pulse must have a predetermined bandwidth in order to excite the nuclear spins in the entire sample volume.

Figure 4:
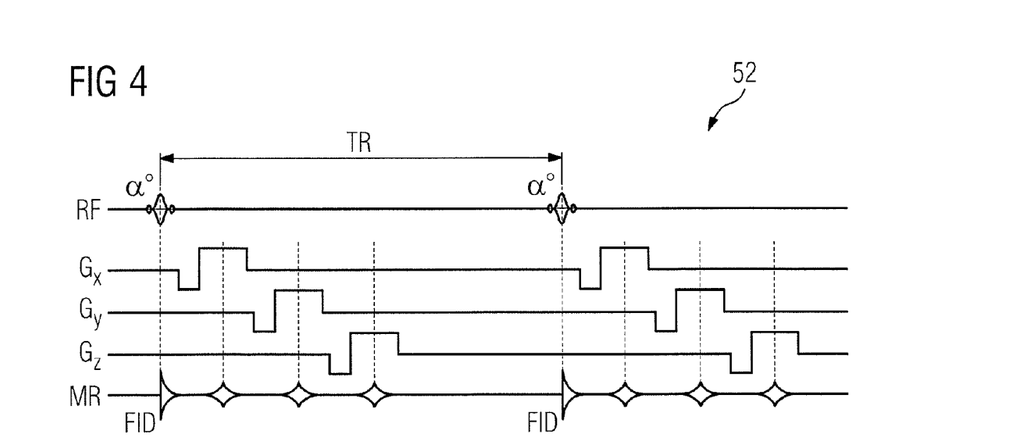
FIG. 4 schematically shows the chronological sequence of signals in an implementation of an embodiment of the method according to the invention.

FIG. 4 shows an example of a time curve of different signals and fields during an example method according to FIG. 2. Time is plotted on the horizontal axis with increasing values to the right. The field strength of the radio-frequency pulse that is provided to excite the nuclear spins in S10 by a flip angle 0 is designated with RF. Gx, Gy and Gz designate the magnetic field strength of the gradient fields in the x-, y- and z-direction that have a field strength 0 during Step S10. Immediately upon excitation, the excited atomic nuclei begin to emit a radio-frequency signal MR due to a precession in the magnetic field B0. This signal rapidly declines again due to the dephasing.

In Step S20, the nuclear spins due to a gradient echo (as shown in FIG. 4) are rephased by a negative and subsequent positive square wave signal of the gradient field Gx, which produces a rise and fall of the resonance signal MR. Because the gradient field Gx is applied, the Larmor frequency is dependent on the location in the direction of this gradient along a first line or axis. Spatial information with regard to the signal origin can be determined along the direction of the gradient via a frequency analysis (a Fourier transformation, for example) of the signal MR under this gradient. In an area with a constant magnetic field that results from the superposition of B0 and Gx and extends laterally from the first line, the Larmor frequency is the same and the signals of nuclear spins along this first surface add to form the signal. The sum signal is an integral of the signals on the first surface; the nuclear spins of the two-dimensional first surface can be considered as being projected into the signal on a one-dimensional first axis or line. In an ideal homogeneous magnetic field with field lines aligned in parallel, the first axis is a line and the first surface is a plane that is aligned orthogonal to the first axis.

Information about a relative temperature distribution in the sample 40 or the patient along the first axis can be derived from the temperature dependency of the dephasing, but the signal MR gives no information regarding the absolute temperature.

In Step S20, the signal MR for the first axis is received from the body coil 14 or the local coil 15, and is detected by the radio-frequency unit 22 and stored by the controller 23.

As shown in FIG. 2, Step S20 (the acquisition and storage) repeats in Steps S30 and S40 respectively for the gradient fields Gy and Gz and the respective second and third axes and surfaces. The first axis, second axis and third axis, as well as the first, second and third surfaces, are not parallel to one another, such that the axes span a three-dimensional space. If the axes are orthogonal to one another, they span a Cartesian coordinate space for the sample volume.

In order to determine a temperature change, two signals MR at different times and otherwise optimally unchanged conditions must be compared. For this purpose, in Step S50 a decision is made as to whether a second projection of the signals has already been acquired. If this is not the case, Steps S10 through S40 are repeated and a second projection on the respective axis is acquired and stored, as is also shown in the second signal series of the second gradient echo 52 indicated in FIG. 4. Naturally, it is also possible that decision in Step S50 does not take place, but rather that Steps S10, S20, S30 and S40 are repeated again in an established sequence.

Figure 5:
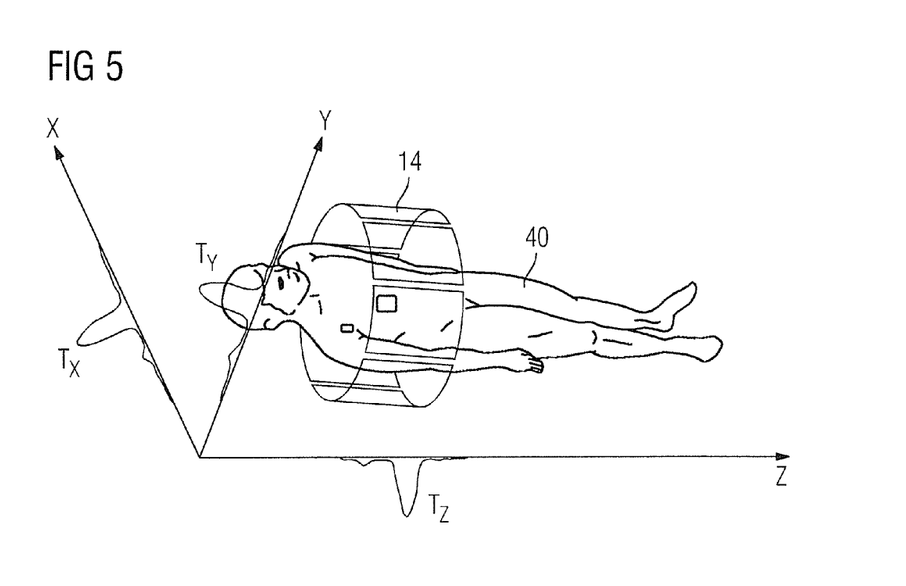
FIG. 5 schematically shows a result of the method according to the invention.

The difference between the respective first projection and second projection over the respective area on the axis is calculated in Step S60. Under the assumption that the other conditions in the sample have changed only slightly in the measurement time period, the projection on the axes (as schematically shown in FIG. 5) then is a one-dimensional depiction of the temperature change in the patient 40 on each of the three axes. For example, from the combination of these three axes it is possible to determine a position of a maximum of the temperature change with the coordinates Tx, Ty and Tz, as well as the maximum value.

Since only three gradient echoes are required for the measurement shown in FIG. 4, the measurement time is very short, such that disruptions due to changing boundary conditions (for example, due to movement of the patient 40) are minimal. A temperature change due to thermal transport or metabolic processes is also to be disregarded, such that the determined temperature change is essentially caused only by a radio-frequency pulse RF in the repetition of Step S10. The method according to the invention thus enables the thermal exposure due to a single radio-frequency pulse RF to be determined both locally and quantitatively. However, it is also possible for the first and second projections of the signals MR to be acquired with a single radio-frequency pulse RF by generating, instead of a new excitation due to a radio-frequency pulse RF according to Step S50, a signal from the first excitation in S10 by additional gradient echoes, and consequently Step S20 follows Step S50 given the repetition for the respective second projection.

Figure 6:
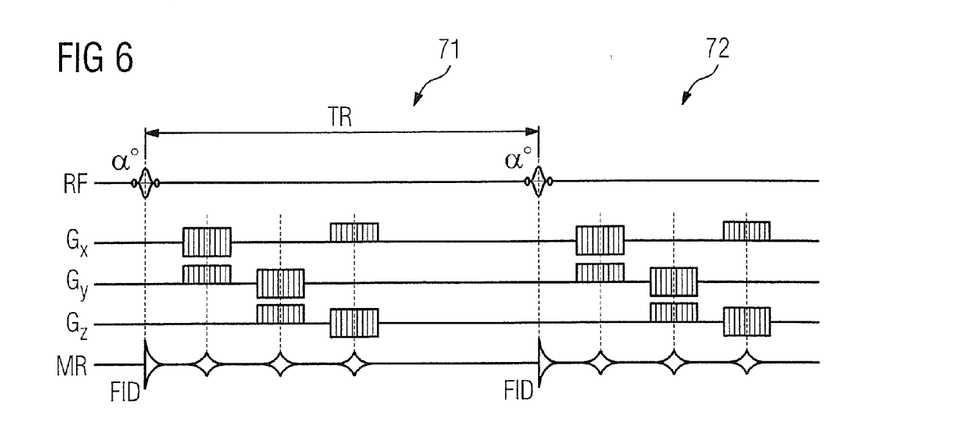
FIG. 6 schematically shows the chronological sequence of signals that occurs in an implementation of a further embodiment of the method according to the invention.

FIG. 6 shows a further possible embodiment of the method according to the invention. Instead of a single gradient field Gx, Gy, Gz in Steps S20, S30, S40, a sequence of gradient fields PE for phase coding (Phase Encoding Train) is generated by a respective first gradient coil, while at the same time a sequence of gradient fields RO (EPI Read Out Train, EPI=Echoplanar Imaging) for generation of the phase echoes is applied simultaneously at a second gradient coil. A pairing of RO and PE pulses at Gx with Gy, Gy with Gz and Gz with Gx is shown in FIG. 6. Other pairings and sequences are also conceivable, in which each gradient coil Gx, Gy, Gz is respectively used once to generate the phase coding and once to generate the phase echo. This first sequence of Steps S10, S20, S30 and S40 is designated as a first echo train 71.

Through the phase coding it is possible to associate a second coordinate with the individual magnetic resonance signals MR. Therefore, in Steps S20, S30 and S40 in the method of FIG. 6, not only are magnetic resonance signals MR acquired as a projection from an area on a line or axis (and therefore one-dimensionally), but rather the phase coding additionally allows the magnetic resonance signals MR to be differentiated in further, additional dimension, and magnetic resonance signals MR to be acquired in stored in a two-dimensional matrix for each Step S20, S30, S40. The projection takes place along a line on a surface, or the matrix on the surface. If second matrices with values of the magnetic resonance imaging are respectively stored after a second repetition—controlled in S50—of Steps S10, S20, S30 and S40 in a second echo train 72, or S20, S30 and S40 in an embodiment without second radio-frequency pulse RF, the temperature change in three respective two-dimensional distributions is determined via a difference calculation. Depending on whether a second radio-frequency pulse RF has been emitted as part of the second echo train 72, the temperature change represents a change generated essentially by a radio-frequency pulse or delivers an image of a change caused by a different source (HIFU, High Intensity Focus Ultrasound).

Figure 7:
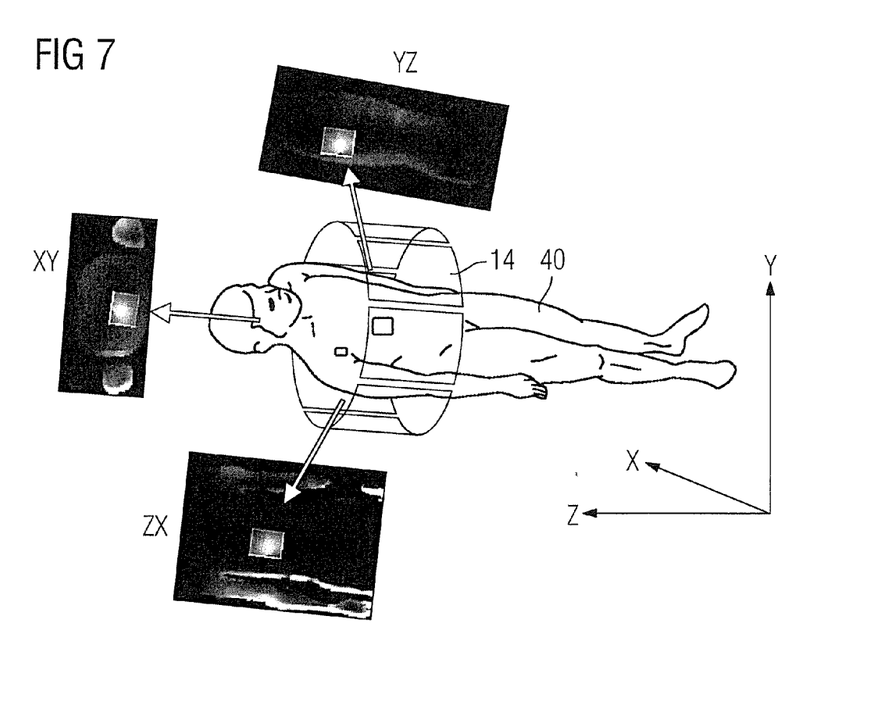
FIG. 7 schematically shows a result of a further embodiment of the method according to the invention.

FIG. 7 schematically shows three two-dimensional representations of the temperature change in the patient 40, respectively in the X-Y, Y-Z and Z-X plane. The two-dimensional representation not only facilitates determination of the location of a temperature change but rather also facilitates estimating the spatial distribution via the two-dimensional projections. At the same time, the generation of three two-dimensional mapping is always still significantly faster than a complete detection of the temperature change in three dimensions, which is why changes that are only short-term can also be temporarily detected.

Figure 3:
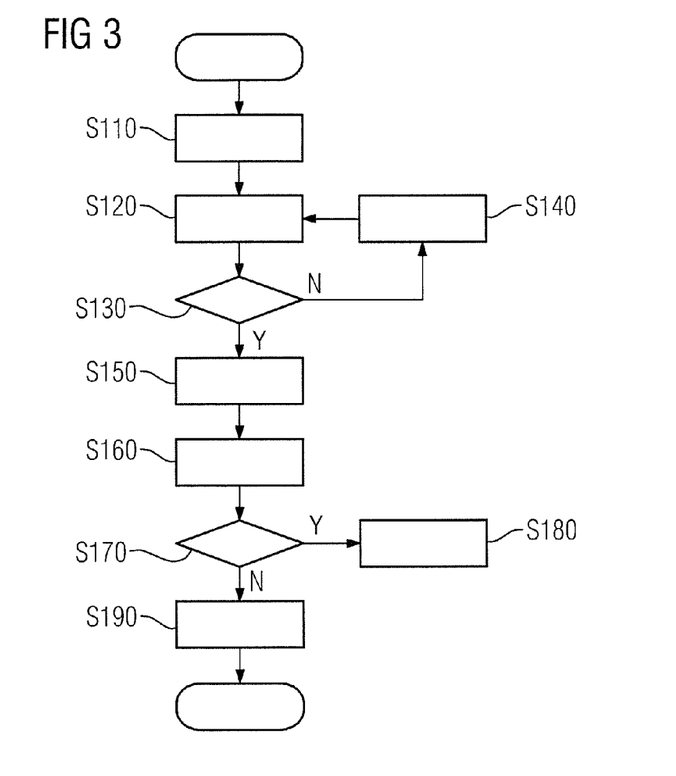
FIG. 3 is a flowchart of another embodiment of a method according to the invention.

A method that enables a monitoring of the specific absorption rate SAR, and in particular the determination of possible regions with pronounced temperature increase (what are known as hot spots), is schematically depicted in a flowchart in FIG. 3. The method according to the invention is thereby part of this method, which is executed by a magnetic resonance tomography apparatus according to the invention, for example.

A mathematical model for a patient 40 and a first parameter set for a radio-frequency pulse RF in the controller 23 are loaded from a memory or via an interface in Step S110.

In Step 120, the controller executes a simulation of the SAR exposure. For example, this can take place via a simulation with finite elements or a different method. The result of the simulation is a model of the SAR exposure in the patient 40 according to the loaded mathematical model of the patient 40.

In Step S130, the simulated values are compared with predetermined limit values for SAR exposure and/or temperature increase. If this simulation supplies SAR values that lie above the limit values, even if only locally, in Step S140 the parameter set is adapted for the radio-frequency pulse RF and the simulation and adaptation of the parameter set are repeated until the simulated values are below the predetermined limit values.

This parameter set is predetermined in Step S150 of the radio-frequency unit S150 to generate radio-frequency pulses RF. The method according to the invention that is shown in FIG. 2 is executed in Step S160, wherein according to Step S50 a Step S10 takes place with a second excitation via the radio-frequency pulse RF.

The temperature change determined with the method according to the invention is evaluated in Step S170. If it is established in S170 that the temperature increase measured via the method according to the invention is also below the predetermined limit values, in S190 the magnetic resonance tomography data acquisition is executed with the determined parameter set. In contrast to this, no magnetic resonance tomography data acquisition is executed if it is established that the temperature increase exceeds predetermined limit values.

Naturally, the method according to the invention need not be executed in all three spatial dimensions. For example, in the method shown in FIG. 6, the mappings in the ZX plane and in the YZ plane may already be sufficiently localized, and a mapping to the XY plane thus is no longer required. Execution of the method according to the invention is likewise conceivable with only two one-dimensional mappings or a single two-dimensional mapping. It is also conceivable to execute more methods according to the invention with different coordinate systems in succession or interleaved with one another.

Furthermore, in the method and device according to the invention it is possible that the excitation of the nuclear spins takes place in a homogeneous basic magnetic field B0 and over the entire sample volume, but also via applied gradient fields Gx, Gy, Gz, or a selective excitation takes place via a body coil and the projection and acquisition is limited to this selected volume. This is particularly advantageous if—for example given a hyperthermic treatment by means of focused ultrasound—the region to be examined is already known and spatially limited, and thus the examination time can be reduced and/or the resolution can be improved.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of rapid detection of regions of modified temperature in a sample volume, comprising:
    a) operating a magnetic resonance data acquisition unit in order to excite nuclear spins in the sample volume by radiating a radio-frequency pulse in a magnetic field in order to cause said sample volume to emit a magnetic resonance signal;
    b) operating the data acquisition unit to acquire and store a first projection of an integral of the magnetic resonance signal of the sample volume, while the sample volume is at an initial temperature, across a first n-dimensional space onto a first m-dimensional space by using a multi-echo sequence, wherein n+m=3, in order to acquire and store a first projection of an integral of the magnetic resonance signal of the sample volume across a second n-dimensional space onto a second m-dimensional space using a multi-echo sequence; wherein the first and second m-dimensional space are not parallel to one another, and wherein also n+m=3;
    c) repeating b), in order to acquire and store a second projection of the magnetic resonance signal of the sample volume, while the sample volume is at a modified temperature; and
    d) in a processor, calculating a difference between the first projection and second projection across the first n-dimensional space, and calculating a difference between the first projection and second projection across the second n-dimensional space, from the respective calculated differences, determining a temperature change in said sample volume between the initial temperature and the modified temperature, and making the determined temperature change available in electronic form at an output of the processor.

2. A method as claimed in claim 1, comprising, in c), also including a repetition of a) before repeating b).

3. A method as claimed in claim 1, comprising in b1) after b) and in d1) after d):
    b1) operating the data acquisition unit in order to acquire and store a first projection of an integral of a magnetic resonance signal in the sample volume across a third n-dimensional space onto a third m-dimensional space using said multi-echo sequence, wherein the first and third m-dimensional space as well as the second and third m-dimensional space are not parallel to one another, wherein n+m=3; and
    d1) in said processor, calculating a difference of the first projection and second projection across third n-dimensional space to determine said temperature change.

4. A method as claimed in claim 3, comprising determining a three-dimensional position of a region of the temperature change in the sample volume from the projections on the first m-dimensional space, the second m-dimensional space and the third two-dimensional space.

5. A method as claimed in claim 3, wherein n=1 and m=2.

6. A method as claimed in claim 3, wherein n=2 and m=1.

7. A method as claimed in claim 1, wherein n=1 and m=2.

8. A method as claimed in claim 1, wherein n=2 and m=1.

9. A method as claimed in claim 1 comprising using a single shot sequence as said multi-echo sequence.

10. A method as claimed in claim 1, comprising acquiring said projections during spin echoes generated by gradient fields in said multi-echo sequence.

11. A method as claimed in claim 10, comprising determining said temperature change as a temperature change caused by the radio-frequency pulse.

12. A method as claimed in claim 1, comprising acquiring said projections during spin echoes generated by means of a refocusing pulse in said multi-echo sequence.

13. A method as claimed in claim 1, comprising before c) causing a temperature change in at least one partial region of the sample volume by a heat source or a cryo-source.

14. A method as claimed in claim 13, comprising generating an ultrasound field in the sample volume as said heat source.

15. A method as claimed in claim 13, comprising generating radio-frequency electromagnetic field in the sample volume as said heat source.

16. A magnetic resonance apparatus comprising:
a magnetic resonance data acquisition unit;
a control unit configured to (a) operate the magnetic resonance data acquisition unit in order to excite nuclear spins in the sample volume by radiating a radio-frequency pulse in a magnetic field in order to cause said sample volume to emit a magnetic resonance signal;
said control unit configured to (b) operate the data acquisition unit in order to acquire and store a first projection of an integral of the magnetic resonance signal of the sample volume, while the sample volume is at an initial temperature, across a first n-dimensional space onto a first m-dimensional space by using a multi-echo sequence, wherein n+m=3, and in order to acquire and store a first projection of an integral of the magnetic resonance signal of the sample volume across a second n-dimensional space onto a second m-dimensional space using a multi-echo sequence; wherein the first and second m-dimensional space are not parallel to one another, and wherein also n+m=3;
said control unit configured to (c) repeat (b), in order to acquire and store a second projection of the magnetic resonance signal of the sample volume, while the sample volume is at a modified temperature; and
a processor configured to (d) calculate a difference between the first projection and second projection across the first n-dimensional space, and to calculate a difference of the first projection and second projection across the second n-dimensional space, and from the respective calculated differences, to determine a temperature change in said sample volume between the initial temperature and the modified temperature, and to make the determined temperature change available in electronic form at an output of the processor.

17. An apparatus as claimed in claim 16,
wherein said control unit is configured, in (b1) after (b), to operate the data acquisition unit in order to acquire and store a first projection of an integral of a magnetic resonance signal in the sample volume across a third n-dimensional space onto a third m-dimensional space using said multi-echo sequence, wherein the first and third m-dimensional space as well as the second and third m-dimensional space are not parallel to one another, wherein n+m=3; and
said processor in (d1) after (d), is configured to calculate a difference between the first projection and second projection across third n-dimensional space to determine said temperature change.

18. An apparatus as claimed in claim 17, wherein said processor is configured to determine a three-dimensional position of a region of the temperature change in the sample volume from the projections on the first m-dimensional space, the second m-dimensional space and the third two-dimensional space.

19. An apparatus as claimed in claim 16 wherein said control unit is configured to operate said data acquisition unit using a single shot sequence as said multi-echo sequence.

20. An apparatus as claimed in claim 16 wherein said data acquisition unit comprises a plurality of local coils operated by said control unit to radiate said radio-frequency pulse into the sample volume and to receive radio-frequency signals from the sample volume as data representing said projections.

* * * * *